US005438205A

United States Patent [19]

Schroeder

[11] Patent Number: 5,438,205

[45] Date of Patent: Aug. 1, 1995

[54] ION SOURCE GASEOUS DISCHARGE INITIATION IMPULSE VALVE

[75] Inventor: James B. Schroeder, Madison, Wis.

[73] Assignee: National Electrostatics Corp., Middleton, Wis.

[21] Appl. No.: 225,952

[22] Filed: Apr. 8, 1994

[51] Int. Cl.6 .............................................. H01J 37/00

[52] U.S. Cl. ................................ 250/423 R; 250/430

[58] Field of Search .................... 250/288, 423 R, 430; 313/362.1

[56] References Cited

U.S. PATENT DOCUMENTS

| | | | |
|---|---|---|---|
| 2,733,346 | 1/1956 | Oppenheimer | 250/41.9 |
| 2,847,577 | 8/1958 | Schmidt | 250/41.9 |
| 2,873,375 | 2/1959 | Dorward, Jr. | 250/41.9 |
| 3,313,935 | 4/1967 | Bell, Jr. et al. | 250/41.9 |
| 3,513,351 | 5/1970 | Kelley | 315/108 |
| 3,895,231 | 7/1975 | Sodal et al. | 250/288 |
| 3,992,626 | 11/1976 | Bursack | 250/288 |
| 4,018,241 | 4/1977 | Sodal et al. | 250/288 |
| 4,201,913 | 5/1980 | Bursack | 250/288 |
| 4,691,109 | 9/1987 | Magee et al. | 250/426 |
| 4,855,594 | 8/1989 | Kimock et al. | 250/282 |
| 4,883,969 | 11/1989 | Ishida et al. | 250/423 R |
| 5,237,175 | 8/1993 | Wells | 250/288 |

*Primary Examiner*—Bruce C. Anderson

*Attorney, Agent, or Firm*—Lathrop & Clark

[57] ABSTRACT

An impulse valve for an ion source is positioned between an ion source chamber and a gas metering valve. The impulse valve is a two-position solenoid-controlled valve which is closed in its off position. In the off-position, the valve forms a reservoir between the valve stem of the impulse valve and the metering orifice of the metering valve. In the off condition, the gas reservoir fills with gas that over time equilibrates to the pressure of the gas supplied to the metering valve. The volume of the gas reservoir and the pressure of the gas which is supplied to the metering valve are chosen so that when the two-position valve is open, the gas contained in the reservoir is sufficient to pressurize the ion source chamber to a pressure of approximately 0.1 Torr. Thus, when the impulse valve opens, a pulse of gas flows into the ion source chamber, where a plasma discharge is initiated. As ions and gas flow through the ion discharge port, the pressure in the ion chamber drops until it reaches an equilibrium pressure with the supply of gas through the metering valve. This pressure is typically one-tenth of the initiation pressure, or 0.01 Torr. The impulse valve also serves to provide a fail-safe shut-down mechanism, so that when power is lost, the valve returns to its closed condition.

14 Claims, 3 Drawing Sheets

ION SOURCE GASEOUS DISCHARGE INITIATION IMPULSE VALVE

The present invention relates to ion sources in general and to gaseous discharge ion sources in particular.

BACKGROUND OF THE INVENTION

Accelerated ions (atoms or molecules with positive or negative electrostatic charges) find important uses in industry and science. Historically, ions which have been accelerated to high velocities have been used in particle physics and condensed matter physics to probe the fundamental laws of the universe. Over time, practical uses have arisen for accelerated ions. For example an ion accelerator allows the precise injection of ions onto a substrate. In the tool industry, this capability has been used to develop new surface hardening techniques. In the semiconductor industry, ion accelerators have been critical to the implantation of doping ions which create transistors, diodes and gates on a semiconducting substrate, such as silicon.

Ion accelerators, of the tandem type where first negative ions are accelerated then striped to form positive ions, have also found use in such fields as archeology, where the ability to eliminate molecular isobars such as $CH_2$ has made possible dramatically increased accuracy of carbon-14 dating through a mass determination of a representative sample of carbon atoms. This technique allows the determination of the carbon-14/carbon-12 ratio with a small sample and with much higher precision, because decay of the carbon-14 atom is not necessary to detect its presence.

Ion or particle accelerators use static or electromagnetic fields which interact with the static charge on the ion to produce an accelerating force. Thus, the accelerator requires a source of ionized atoms or molecules to be accelerated.

Ions may readily be extracted from a plasma formed of the molecular species of interest. A plasma can be created by electric arc, but a microwave-heated plasma produces a more durable, more controlled ion source. The plasma is typically of fairly low density, being formed of a gas with a pressure of approximately 0.01 Torr. This low pressure allows a sufficient mean-free path of the formed ions, such that they can be drawn out of the plasma chamber by a suitable static or electromagnetic field and introduced to the particle accelerator.

As gas is withdrawn from the plasma chamber of the ion source, replacement gas must be supplied. This is typically done through a metering valve which allows a very precise, low flow of gas to the plasma chamber, which balances the drain of ions which are extracted.

In steady-state operation, the inflow of gas equals the outflow of ions. For initiation of a plasma, however, a higher density of gas is required. The higher density of gas is required because, in order to be heated by a microwave radiation, the gas must absorb energy from the excitation source. The relative opaqueness of the gas to energy depends on its density. Once ionized, the free electrons in the plasma are extremely opaque, and so a relatively lower pressure of gas is sufficient to sustain the plasma. Thus, in order to initiate the plasma in the ion source, the supply of gas to the ion source must be increased so as to increase the pressure in the ion source approximately a factor of ten over its steady-state pressure.

Pressure is normally increased by opening the metering valve and then immediately stopping it down. While a seemingly straightforward process, in practice, it is tricky and, further, not easily subject to automatic control. In the past, when the acceleration of ions was exclusively the domain of scientists, principally particle physicists, the difficulty of starting the ion source was an accepted part of the research process. However, as accelerators have become more ubiquitous, their users have included scientists from other disciplines, from chemistry to biology to semiconductors, who are less interested in the particularities of the ion source and the accelerator, than in the end use of the ion beam produced therefrom.

Similarly, the industrial user demands a reliable, consistent system for initiating the ion source, which does not require skill and experience on the part of the operator. Because of the complexity of the feedback between gas flow and the ion source, automatic control systems have proven less than satisfactory at solving the problem of ion source plasma initiation.

What is needed is an ion source initiation system for reliably initiating the plasma in the ion source without operator intervention.

SUMMARY OF THE INVENTION

The present invention is directed to an impulse valve which is positioned between an ion source chamber and a gas metering valve. The valve is a two-position solenoid-controlled valve which is closed in its off position. In the off-position, the valve forms a reservoir between the valve stem of the impulse valve and the metering orifice of the metering valve. In the off-condition, the gas reservoir of the impulse valve fills with gas and equilibrates to a pressure equal to the pressure of the gas supplied to the metering valve. The volume of the gas reservoir and the pressure of the gas which is supplied to the metering valve are chosen so that when the two-position valve is open, the gas contained in the reservoir is sufficient to pressurize the ion source chamber to a pressure of approximately 0.1 Torr. Thus, when the impulse valve opens, a pulse of gas flows into the ion source chamber, where a plasma discharge is initiated. As ions and gas flow through the ion discharge port, the pressure in the ion chamber drops until the outflow from the ion source is equal to the inflow of gas through the metering valve. This pressure is typically one-tenth of the initiation pressure, or 0.01 Torr.

The impulse valve serves an additional function, that of providing a fail-safe shut-down mechanism, so that when power is lost, the valve returns to its non-operative condition, which closes the flow of gas into the ion chamber. Because the ion chamber is in turn vented into the accelerator, in the absence of the impulse valve, the entire accelerator could become flooded with gas during a power outage.

It is an object of the present invention to provide a means for initiating a plasma in an ion chamber.

It is also an object of the present invention to provide the initiation of a plasma in an ion chamber without the requirement for a control system.

It is yet another object of the present invention to provide a gas supply for an ion source which is fail-safe.

It is yet another object of the present invention to provide a more user-friendly ion source.

Further objects, features, and advantages of the invention will be apparent from the following detailed description when taken in conjunction with the accompanying drawings.

DESCRIPTION OF THE PREFERRED EMBODIMENT

Figure 1:
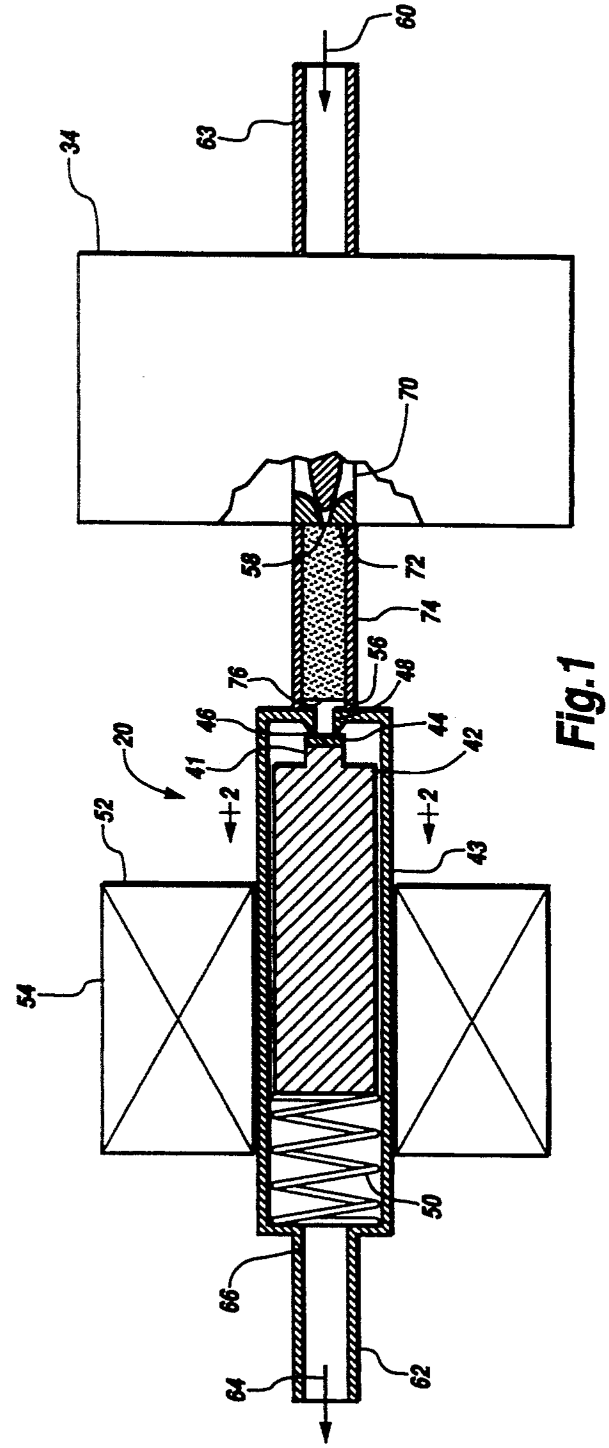
FIG. 1 is a schematic cross-sectional view of the impulse valve of this invention.

Referring more particularly to FIGS. 1-5, wherein like numbers refer to similar parts, an impulse valve 20 is shown in FIG. 1. The valve 20 is employed as part of an ion source 22 shown in FIG. 6. The impulse valve 20 is positioned between an ion source chamber 24 and a gas metering valve 34. The valve 20 is a two-position valve which is closed in its off position. In the off-position, the valve 20 forms a reservoir 56 between a valve stem 42 of the impulse valve 20 and the metering orifice 58 of the metering valve 34. In the off-condition, the gas reservoir 56 of the impulse valve fills with gas and equilibrates to a pressure equal to the pressure of the gas supplied to the metering valve 34.

The volume of the gas reservoir 56 and the pressure of the gas which is supplied to the metering valve 34 are chosen so that when the two-position valve 20 is open, the gas contained in the reservoir 56 is sufficient to pressurize the ion source chamber 24 to a pressure of approximately 0.1 Torr. Thus, when the impulse valve 20 opens, a pulse of gas flows into the ion source chamber 24, where a plasma discharge is initiated. As ions and gas flow through the ion discharge port 26, the pressure in the ion chamber 24 drops until it reaches a pressure which is supported by the inflow of gas through the metering valve 34. This pressure is typically one-tenth of the initiation pressure, or 0.01 Torr.

Figure 6:
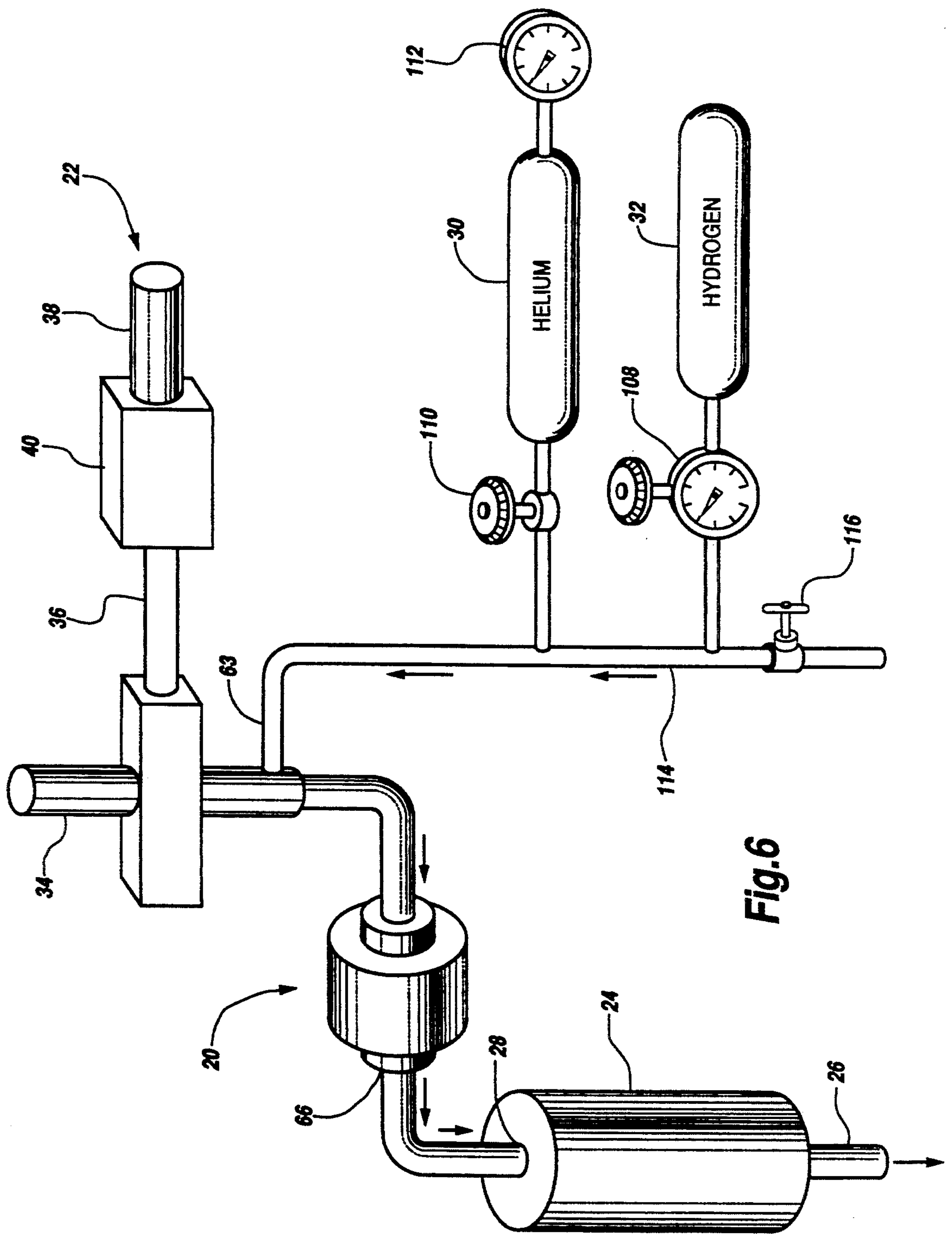
FIG. 6 is a somewhat schematic isometric view of an ion source employing the value of FIG. 1.

The ion source 22, shown schematically in FIG. 6, is used to generate and supply ions to an accelerator (not shown). The accelerator accelerates the ions up to relativistic speeds through the use of static or dynamic electrical fields. The ions, once accelerated, may be analyzed to determine their physical properties, or they may be utilized in scientific and industrial processes.

The ions are generated in an ion source chamber 24. The source chamber 24 has an ion outlet 26 and a gas inlet 28. As is well known in the art, ions may be extracted through the outlet 26 by a suitable electrostatic or magnetic field which draws the ions to the ion outlet 26. The plasma within the ion source 22 is typically generated by use of microwave energy preferably tuned to excite the molecular species of interest. The gas in the chamber 24 which is being ionized will typically be at a pressure of approximately 0.01 Torr.

The outlet 26 of the ion chamber 24 empties into an accelerator (not shown) which is typically maintained at vacuum of better than $10^{-5}$ Torr. The ions which are withdrawn from the chamber 24 are replenished with un-ionized gas from gas bottles 30, 32. The gas bottles 30, 32 act as gas supplies and store or preferably supply the gas at a pressure near or at one atmosphere. The flow of gas from the bottles 30, 32 to the ion source chamber 24 is regulated by the metering valve 34, shown schematically in FIG. 6. The metering valve 34 is a variable opening valve which provides a steady flow of gas to the ion chamber 24. The metering valve 34 has a variable orifice 58, shown in FIG. 1, through which gas flows. The opening of the orifice 58 or other means known in the art are used to produce a constant, low-volume flow of gas to the ion chamber 24 to make up the gas loss from the ion chamber 24 as ions flow through the ion outlet 26.

As shown in FIG. 6, the metering valve has a valve stem 36 which is connected to an electric motor 38 on which is mounted a shaft encoder 40. The motor, together with the shaft encoder 40 allow the orifice 58 of the valve 34 to be adjusted under machine control. In order to initiate a plasma in the ion source chamber 24, a density of gas approximately ten times that desirable when ions are being produced is necessary. A plasma, because it contains free electrons, readily absorbs a broad spectrum of electromagnetic radiation and even at low densities is effective at maintaining itself in the presence of a microwave source. However, for initiating the plasma, the pressure of gas in the ion source chamber 24 must be increased by a factor of approximately ten in order to have sufficient gas present to absorb sufficient energy to initiate the formation of a plasma.

In conventional ion sources similar to that shown in FIG. 6 without the impulse valve 20, the metering valve 34 must be adjusted to increase the flow of gas by a factor of ten or more, whereupon a plasma is initiated in the ion source chamber 24, following which the metering valve must be returned to a steady-state position. In practice, the control and adjusting of the metering valve requires skillful manipulation in order to initiate the plasma and obtain the steady-state conditions needed for a consistent supply of ions.

Attempts have been made to automate the initiation of the plasma by implementing a control system to control the position of the metering valve. However, the complexity of the gas and plasma dynamics makes implementing control laws that are reliable difficult.

The valve 20 provides for the reliable ignition of plasma in the ion source chamber 24 without the requirement for a control system. The valve 20 is shown in FIG. 1 in the closed position. A valve stem 42 is positioned within the housing 43 of the valve 20 for axial movement therein. A narrower diameter valve portion 41 protrudes toward the metering valve 34 from the valve stem 42. A valve seat 44 is mounted on the protruding valve portion 41 and is preferably made of a seating material, typically teflon or other resilient, non-volatilizing plastic or rubber. The valve seat 44 is biased by a spring 50 against a frustoconical lip 46 which extends inwardly from the housing 43. The lip 46 encircles the inlet opening 48 of the valve 20. When the valve seat 44 is engaged against the housing lip 46 the flow of gas through the valve opening 48 is blocked.

The valve stem 42 acts as the core of a solenoid 52. When the coil 54 of the solenoid 52 is energized, the valve stem 52 retracts against the spring 50, allowing the escape of gas from a small reservoir 56 formed between the valve seat 44 and the orifice 58. The reservoir 56 is defined primarily within a tube 74 extending between the metering valve and the impulse valve 20, and extends from the valve seat 44 within the impulse valve housing 43 to the orifice 58 within the metering valve 34. Gas, shown by arrows 60, is supplied to the inlet 63 of the metering valve 34 at a known pressure, typically at a pressure slightly above atmospheric, for example five pounds per square inch gauge, or twenty pounds per square inch absolute. The portion 62 of the valve 20 which is downstream of the valve seat 44 is in communication with the ion chamber 24 which in turn communicates with an ion accelerator which is maintained at high vacuum. Thus, when the valve 20 is opened, relatively high pressure gas at 20 PSI is throttled down to approximately 0.01 Torr, which is approximately one one-hundred-thousandth of the supply pressure.

The low pressure gas 64 flows from the valve housing 43 outlet 66 to the input 28 of the ion source chamber 24. Because the metering valve 34 is not a regulator but rather a throttling valve, gas will continue to flow from the high pressure side 70 of the valve 34 to the output or low pressure side 72, until the pressure on either side of the valve is equilibrated. Thus, when the valve 20 is in the closed position, the small gas reservoir 56 will, in a relatively short time, become filled with gas at a pressure equivalent to the gas 60 supplied to the metering valve 34.

The volume of the reservoir 56 is chosen so that when the valve 20 is open, sufficient gas is available to fill the ion source chamber to a pressure of approximately ten times the operating pressure, or 0.1 Torr.

Thus, the volume of the reservoir 56 between the valve seat 44 and the metering orifice 58 is chosen so that the reservoir volume times the supply pressure is equal to the volume of the ion source chamber 24 times the desired pressure in the ion source chamber 24. As an example, a typical ion source chamber 24 will have a volume of seven cubic inches. If the desired pressure is 0.1 Torr, and the supply pressure is at approximately twenty pounds per square inch absolute, then the reservoir volume 56 will be 0.0007 cubic inches.

Because of the small size of the reservoir 56, the majority of the tube 74 between the orifice 58 and the valve seat 44 is filled with a plug 76. The plug 76 may be a solid with a sufficiently loose fit within the tube 74 to allow the flow of gas past the plug. Alternatively, the plug 76 may be a permeable filler. In either case the reservoir volume is reduced to the desired size.

Figure 2:
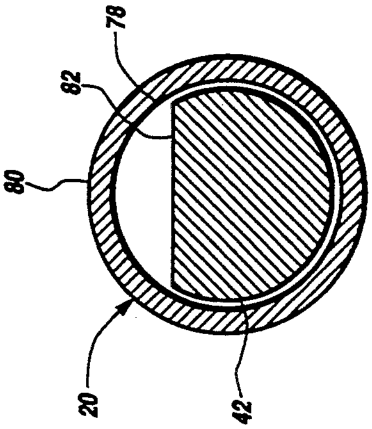
FIG. 2 is a cross-sectional view of the valve of FIG. 1 taken along section line 2—2.

In order to assure the rapid filling of the ion source chamber 24, the flow of gas from the impulse valve 20 should be relatively unrestricted. Thus, as shown in FIG. 2, a flow passage 78 is created between the valve stem 42 and the housing interior wall 80 by a relieved portion 82 of the valve stem 42.

Because the valve 20 is spring-loaded by the spring 50 in the closed position, in the absence of power to the coils 54, the valve 20 will seal the flow of gas from the gas supply bottles 30, 32. This results in a fail-safe ion source. If power fails, the valve will close, preventing gas from leaking in and flooding the particle accelerator downstream of the ion chamber 24. In a conventional ion source using a metering valve, if power is lost, the metering valve or a cut-off valve must be manually closed. Thus, if the accelerator is not being manually attended, when power is lost or if attended but an operator error is made, loss of power may result in vacuum loss for the entire accelerator. Vacuum loss can result in considerable loss of productive time while the accelerator is pumped down to the high vacuum required for its operation. Unintended pressurization can even result in damage to the accelerator.

Figure 3:
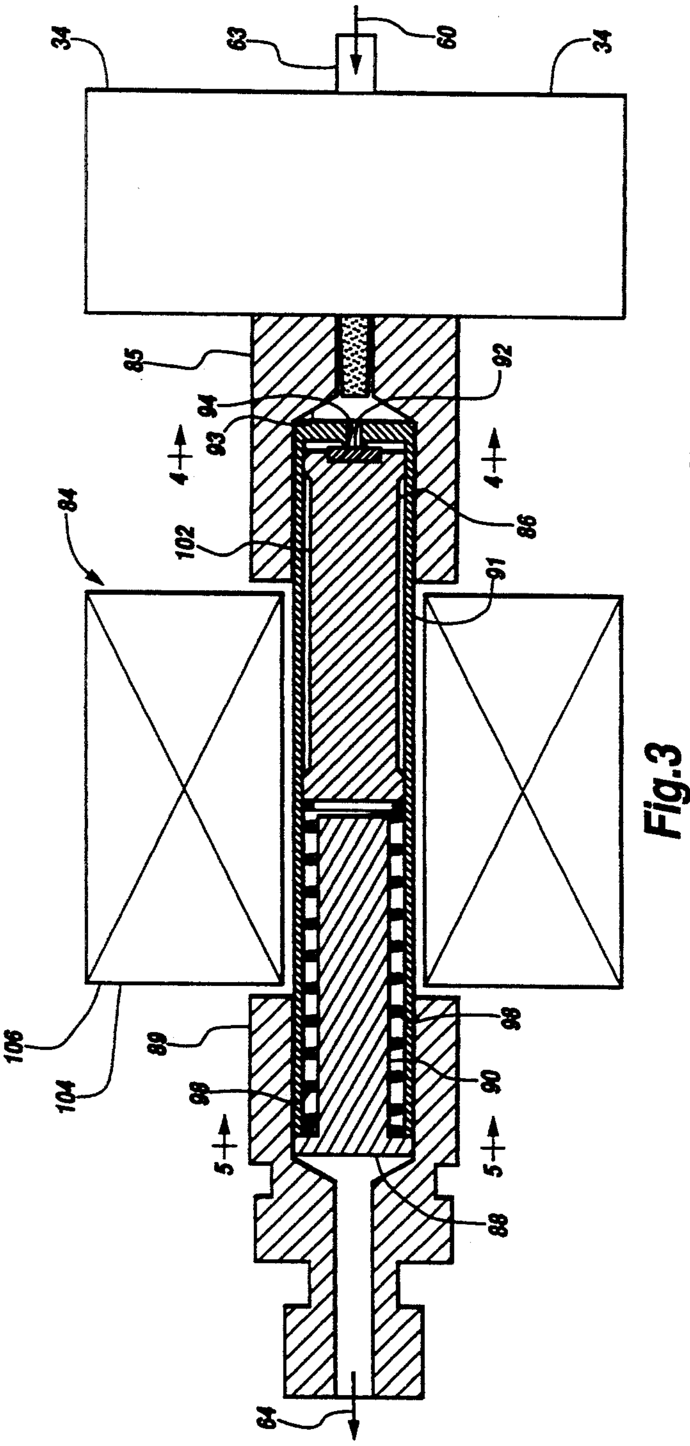
FIG. 3 is a cross-sectional schematic view of an alternative design gas valve of this invention.
Figure 5:
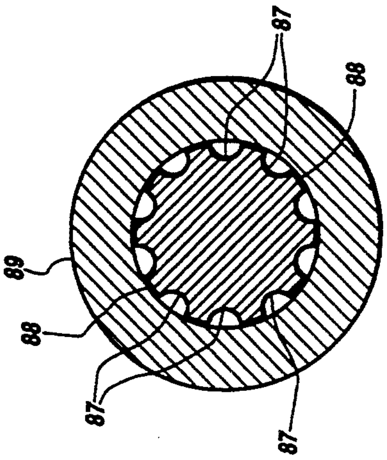
FIG. 5 is a cross-sectional view of the valve of FIG. 3 taken along section line 5—5.
Figure 4:
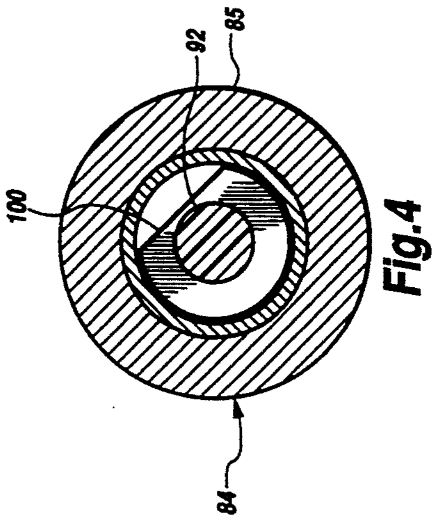
FIG. 4 is a cross-sectional view of the valve of FIG. 3 taken along section line 4—4.

An alternative embodiment valve 84 of this invention is shown in FIG. 3. The valve 84 has a valve stem 86. The valve stem 86 is positioned in a housing 91 mounted between an inlet fixture 85 and an outlet fixture 89. A fixed post 90 extends behind the valve stem 86 to limit the stroke of the valve stem 86 and to retain the spring 98. The post 90 has a plurality of gas passages 87 through its base 88, which, as shown in FIG. 5, allow the passage of gas through the post 90 to the ion source chamber. The valve stem 86 has a valve seat 92 which is biased against the valve lip 94 by a spring 98. As shown in FIG. 4, the valve seat 92 is preferably made of a seating material, typically teflon or other resilient, non-volatilizing plastic or rubber. Valve seats may also be fabricated from soft metals, such as copper. A flow passage 100 extends along the side 102 of the valve stem 86.

The valve 84 is magnetically operated by an electromagnetic coil 104. When the solenoid coil 106 is activated, the valve stem 86 retracts until it comes into engagement with the post 90. The movement of the valve stem opens the flow of gas through the valve 84 from the reservoir 93.

The valve 84 is of a more optimized design than the valve 20. It allows the use of a longer spring and a shorter stroke for valve stem 86, which may result in longer life for the seal formed between the valve seat 92 and the valve lip 94.

As shown in FIG. 6, the preferred gas supply bottle 32 will employ a regulator 108, which will supply gas at a constant pressure to the input 63 of the metering valve 34. With the pressure of the supply gas being constant, the volume of the small reservoir 56 may be chosen to match the volume and desired pressure in the ion source chamber 24. Alternatively, a gas supply cylinder 30 may be connected by a simple manual valve 110. The gas in the cylinder 30 would be allowed to enter the system over a range of pressures, as monitored by gauge 112.

Separately or in combination with a blow-down gas reservoir 30, the small reservoir 56 may be rendered adjustable by, for example, a moveable piston which would selectably extend into the reservoir volume to vary the volume of gas accumulated in the reservoir 56.

The gas lines 114 which connect the gas bottles 30, 32 to the metering valve 34 will preferably have a pump-down valve 116 which allows the lines 114 to be connected to a vacuum system and pre-evacuated before flow of gas from the cylinders 30, 32 is initiated. This prevents the undesirable contamination of the sample gases in the bottles 30, 32.

Though the valves 20, 84 are shown and described as used with a ion source using a plasma produced by a microwave source, the valves 20, 84 could be used with other types of ion sources having different requirements for starting and operating pressures. For example a gaseous discharge ion source such as a Freeman Source or a Duo Plasmatron source which utilizes a hot filament may require starting and operating pressure outside the range suggested for the microwave source ion source.

It should be understood that the valves 20 and 84 can be used with a variety of gases or volatilized vapors, and in particular may be utilized to generate protons and alpha particles with hydrogen and helium respectively.

It should also be understood that the metering valves 20, 84 may be utilized with a fixed metering orifice and that the term "metering valve" as used herein includes the concept of a metering orifice of fixed size, or other means for supplying small quantifies of metered gas, including valves employing fluidic metering or those employing piezo-electric, or electric, or magnetic fields.

It should also be understood that the small reservoir of high pressure gas formed between the valve stem and the metering orifice could extend into the valve stem.

It should also be understood that the valve could be of the rotational type, or could translate hingedly from open to closed positions.

It should also be understood that when the valve 20 is open, gas from the reservoir 56 will normally rapidly flow to fill the chamber 24 to a pressure of approximately ten times the operating normal pressure of the ion source chamber 24. However, if the gas flow rate is significantly increased, for example, by a factor of five, the pressure in the ion chamber 24 will increase by a similar factor. In practice, it is desirable that the flow rate exceed this minimal figure, so that the pressure rise is rapid in the ion source chamber 24 resulting in rapid formation of a plasma in the ion chamber.

It should also be understood that the reservoir 56 could be filled by a flow of gas supplied other than through metering valve 34 thus allowing faster fill time for the reservoir 56 at the cost of a more complex and less fail-safe design.

It should be understood that the invention is not limited to the particular construction and arrangement of parts herein illustrated and described, but embraces such modified forms thereof as come within the scope of the following claims.

I claim:

1. An ion source comprising:

a) an ion source chamber for supplying ions to an accelerator, wherein the chamber has a gas inlet, an ion outlet, and a first selected volume;

b) a gas supply which contains gas to be ionized;

c) a metering valve which receives gas from the gas supply, wherein the metering valve controls the rate of flow of gas from the gas supply;

d) a reservoir into which gas is discharged from the metering valve, wherein the reservoir accepts a second selected volume of gas; and d) a valve having at least two positions, wherein the valve is connected between the reservoir and the gas inlet of the ion source chamber, and wherein the valve in a first position closes off the reservoir, and wherein the valve in a second position connects the reservoir to the ion source chamber to release gas contained within the reservoir into the ion source chamber, and wherein the selected pressure, the first selected volume and the second selected volume are chosen in such ratios that the gas released from the reservoir fills the ion source chamber at a pressure of between about one and about one thousandth of a Torr.

2. The ion source of claim 1 wherein the selected pressure, the first selected volume and the second selected volume are chosen in such ratios that the second volume and the selected pressure result in the quantity of gas released to the ion source chamber filling the second volume at a pressure of about one tenth of a Torr.

3. The ion source of claim 1 wherein the gas supply contains gas at a second pressure and has a regulator for supplying gas at the selected pressure.

4. The ion source of claim 1 wherein the valve is two-positional and is powered by electricity and is maintained in the first, closed, position when unpowered so preventing the flow of gas to the ion source chamber when unpowered.

5. An ion source comprising:

an ion source chamber for supplying ions to an accelerator, wherein the ion source chamber has a gas inlet and an ion outlet and a first selected volume; and b) a valve having at least two positions which is connected to a supply of gas at a selected pressure, the valve in a first position closing off a second selected volume, the valve in a second position connecting the second selected volume to the first selected volume of the ion source, wherein the selected pressure, the first selected volume and the second volume are chosen in such ratios that the second volume and the selected pressure result in a quantity of gas in the second volume sufficient to fill the first selected volume with gas of a pressure of between one and one thousandth of a Torr.

6. An ion source comprising:

a) an ion source chamber for supplying ions to an accelerator having a gas inlet and an ion outlet;

b) a gas supply which contains gas to be ionized and which supplies gas at a selected pressure to an outlet;

c) a metering valve connected to the gas supply outlet, wherein the metering valve has a selected flow rate of gas from the reservoir, wherein the metering valve has an outlet; and d) an impulse valve connected to the metering valve outlet, the impulse valve forming an accumulator between the metering valve and the ion source chamber, wherein when the impulse valve is opened, a flow of gas from the accumulator at least five times the selected flow rate of the metering valve is initiated.

7. The ion source of claim 6 wherein the gas supply contains gas at a first pressure and has a regulator for supplying gas at the selected pressure.

8. The ion source of claim 6 wherein the valve is two-positional and is powered by electricity to assume an open position, such that when power to the valve is lost, the flow of gas to the ion chamber is halted.

9. An ion source comprising:

a) a means for supplying ions to an accelerator having a gas inlet and an ion outlet;

b) a means for containing and supplying at a selected pressure gas to be ionized;

c) a means for metering gas at a selected flow rate from the means for containing gas; and d) a means for opening and closing a flow of gas from the means for metering gas, wherein the means for opening and closing a flow of gas has a means for accumulating a quantity of gas between the means for metering gas and the means for supplying ions, the means for opening and closing when opened allowing a flow of gas from the means for accumulating at least five times the selected flow rate of the means for metering gas.

10. The ion source of claim 9 wherein the means for containing gas contains gas at a first pressure and has a means for regulating gas flow for supplying gas at the selected pressure.

11. The ion source of claim 9 wherein the means for opening and closing is two- positional and is powered by electricity and is further in a closed position when unpowered so preventing the flow of gas to the means for supplying ions when the means for opening and closing is unpowered.

12. An ion source comprising:

a) an ion source chamber which defines an interior first volume;

b) a gas supply which contains gas to be ionized;

c) a reservoir having an interior second volume;

d) a metering valve between the gas supply and the reservoir which allows a quantity of gas at a first pressure to fill the reservoir;

e) a metering valve connected to the gas supply which controls the rate of flow of gas from the gas supply into the reservoir;

f) a valve housing which extends between the reservoir and the ion source chamber, wherein portions of the valve housing define an inlet opening into the housing through which gas must pass to enter the ion source chamber; and g) a valve stem positioned within the housing to selectably block the inlet opening, wherein the valve stem in a first position closes off the reservoir, and wherein the valve in a second position connects the reservoir to the ion source chamber to release the quantity of gas contained within the reservoir into the ion source chamber, wherein the second volume is greater than the first volume, such that the quantity of gas is contained within the ion source chamber at a second pressure which is less than the first pressure, and wherein the second pressure is between one and one thousandth of a Torr.

13. The apparatus of claim 12 further comprising an electromagnetic coil which encircles the valve housing, and wherein the valve stem has ferromagnetic portions such that activation of the electromagnetic coil drives the valve stem to an open position, such that when power to the coil is cut passage of gas from the reservoir to the ion source chamber is blocked.

14. The apparatus of claim 12 wherein the reservoir comprises a tube, and a portion of the tube is filled with a filler.

* * * * *